April 12, 1966 D. H. SHEPPARD 3,246,251

LOW OUTPUT IMPEDANCE FEEDBACK POWER AMPLIFIER

Filed Oct. 18, 1963

DAVID H. SHEPPARD
INVENTOR.

BY Stuart Lubitz
ATTORNEY 3,246,251
Patented Apr. 12, 1966

3,246,251

LOW OUTPUT IMPEDANCE FEEDBACK POWER AMPLIFIER

David H. Sheppard, San Jose, Calif., assignor to Ampex Corporation, Redwood City, Calif., a corporation of California Filed Oct. 18, 1963, Ser. No. 317,184
2 Claims. (Cl. 330—14)

This invention disclosure relates to an amplifier and more particularly to a power amplifier having an extremely low output impedance.

Prior art power amplifiers generally have output impedances greater than 50 ohms. These amplifiers cannot effectively drive long cable lengths and low impedance devices. More specifically, prior art amplifiers have experienced difficulty when connected via a cable several hundred feet in length and having a capacitance of 5–13 pica farads per foot to drive a device having an impedance lower than 400 ohms. It is the purpose of this invention to overcome this shortcoming by providing a power amplifier having a very low output impedance.

In general the invented amplifier assembly comprises a phase splitting means connected to a push-pull or output amplifier means. The output of the push-pull amplifier means and the input of the phase splitting means are interconnected via a feedback circuit branch that includes a solid state element. This feedback connection enables the push-pull amplifer means to present a very low output impedance such as 1 ohm or less to a load. The provisions of this low output impedance enables the amplifier to drive loads as small as 50 ohms. The invented circuit also has the advantages of generating a substantially distortion free sine wave or complex wave output signal. In addition, it utilizes relatively few resistors and capacitors and is constructed of low cost transistors.

It is a general object of this invention to provide an improved power amplifier.

Another object of this invention is to provide an amplifier having a very low output impedance.

Another object of this invention is to provide a power amplifier that is adapted to drive impedances having a value of substantially less than 400 ohms.

Another object of this invention is to provide a power amplifier having low output impedance and utilizing very few capacitors and low cost transistors.

Other objects and advantages of the invented circuit will be appreciated when the detailed written description is read with the drawing wherein.

Figure 1:
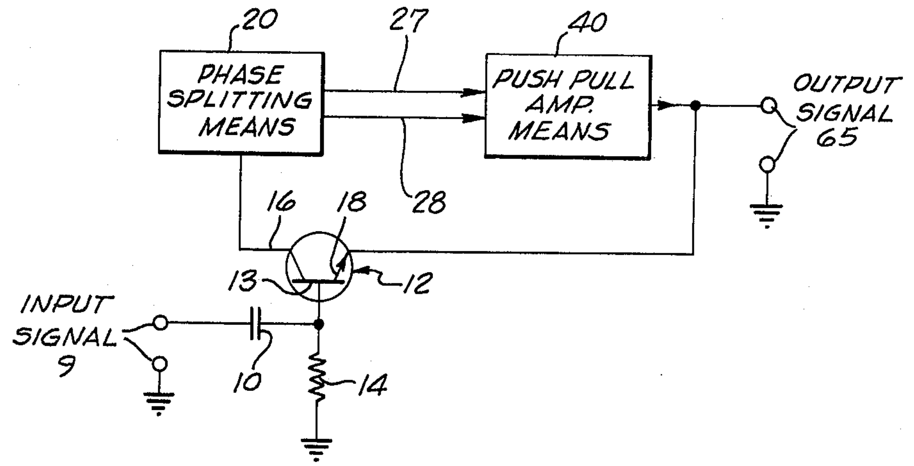
FIGURE 1 is a functional schematic diagram of the invented circuit.

Referring to FIGURE 1 the invented power amplifier assembly comprises an input coupling capacitor 10 that is connected to a feedback solid state element or variable feedback impedance 12. The variable feedback impedance 12 may take the form of a transistor having its base 13 connected to the coupling capacitor 10 and also connected to a bias resistor 14 which is connected to ground. The transistor 12 has its output or collector 16 connected to a phase splitting stage or means 20 while the emitter 18 of the transistor 12 is connected to the output of the push-pull amplifier means 40. It should be understod that the phase splitting means 20 and the amplifier means 40 may take on many forms and include numerous and different types of elements.

It is the broad gist of the invention to interconnect the input of a phase splitting means 20 and the output of the amplifier means 40 by a feedback circuit branch that includes a solid state element such as transistor 12. The interconnection of the push-pull amplifier means 40 and the phase splitting means 20 by such a solid state element enables the power amplifier assembly to have a very low output impedance. In operation when the output signal from a push-pull amplifier means is the same as the input signal coupled to the base 13 of the transistor 12 the output of the collector 16 will be very small. Conversely when the output from the push-pull amplifier means 40 is substantially different from the input applied to the base 13 of transistor 12 the output at the collector 16 will be relatively large. This type of feedback arrangement enables the amplifier assemblies to have a very low output impedance and thereby drive relatively low load impedances.

Figure 2:
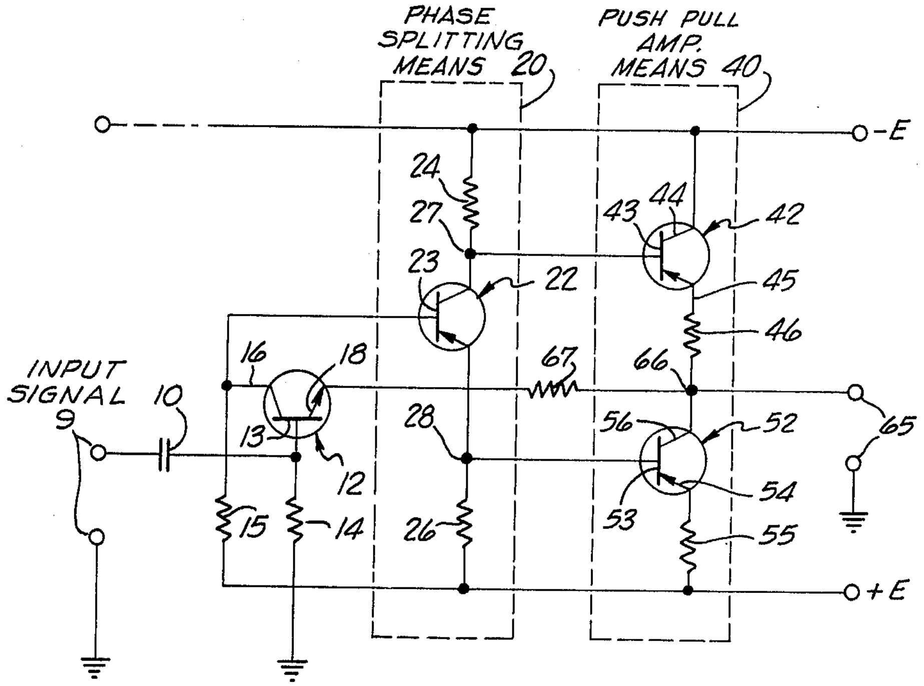
FIGURE 2 is an electrical schematic diagram of a particular embodiment of the invention.

A particular circuit arrangement for performing the general functions described in the above paragraphs is shown in FIGURE 2. The amplifier assembly shown in FIGURE 2 is supplied with an input signal at the input terminals 9. This input signal is connected to an input coupling capacitor 10 which applies the input signal to the base 13 of the solid state feedback element or transistor 12. The base 13 is also connected to ground via the biasing resistor 14. The collector 16 of the feedback transistor is connected to the phase splitting means 20 or more particularly to the transistor 22. The transistor 22, the collector load resistor 24 and the emitter load resistor 26 make up the phase splitting means 20. It should be noted that the connection from the collector 16 to the base 23 of the transistor 22 is connected to a resistor 15 which functions as a bias resistor for the base 23 and as a collector load resistor for the collector 16.

The phase splitting transistor 22 functions in a conventional manner (see Basic Theory and Application of Transistors, Department of Army Technical Manual, published March 1959, pages 125 and 126) to provide an output at the terminal 27 which is 180° out of phase with the output signal at terminal 28. The phase splitting means 20 will thereby provide a positive signal at the terminal 27 and simultaneously a negative signal at the terminal 28. Conversely, when the signal at the terminal 28 is positive the signal at the terminal 27 will be negative.

The output terminals 27 and 28 of the phase splitting means 20 are connected to a push-pull amplifier means 40 and more particularly to the transistors 42 and 52. The transistor 42 which forms one stage or part of the push-pull amplifier means 40 is connected in a common collector configuration with its base 43 directly connected to terminal 27. The collector 44 of transistor 42 is connected to the —E voltage supply or terminal. This —E terminal may be supplied with a —12 volts from any of the well-known conventional sources (not shown). The emitter 45 of the transistor 42 is connected to the amplifier assembly output terminal 65 and to the feedback point 66 via output current limiting resistor 46.

The transistor 52 which forms the other part of the push-pull amplifier means 40 has its base 53 directly connected to the terminal 28 and is connected in a common emitter configuration. The emitter 54 of this transistor 52 is connected to the +E terminal of supply via output current limiting resistor 55. The +E terminal may be supplied from a conventional +12 volt source. The collector 56 of the transistor 52 is directly connected to the feedback point 66 and the output terminal 65.

It should be noted that the direct coupling arrangement of the phase splitting means 20 to the push-pull amplifier means 40 is different than the conventional capacitor coupling usually found in such arrangements. With resistors 24 and 26 being equal in value this type of coupling causes unequal voltage signals to be applied to the push-pull amplifier means 40. These unequal voltages are compensated for or made approximately equal by supplying the larger signal from the collector of the phase splitting transistor 22 to the common collector configuration of transistor 42 resulting in the output signal at the terminals 65 being approximately equal to the input signal at the base 43. The smaller voltage from the emitter 28 of the phase splitting transistor 22 is applied to the base of the common emitter configuration of the transistor 52 resulting in a larger output signal at the output terminals 65 which is approximately equal to output produced by the transistor 42.

It should be understood that the push-pull amplifier means is designed for Class A operation. In accordance with such operation either transistor 42 or 52 will not be made completely nonconductive during normal operation. These transistors 42 and 52 will alternately be made the dominant output element, that is alternately the transistors 42 and 52 will conduct heavily while the other transistor remains relatively nonconductive. This relative conduction and nonconduction is controlled by the phase splitting means 20 which directly supplies input signals 180° out of phase to the base circuits 43 and 53 to alternately bias the transistors 42 and 52 into relatively high conduction states. The utilization of a push-pull amplifier means tends to minimize distortion and allows the transistors to deliver maximum power.

All of the output is supplied to the output terminal 65, while a significant portion of the output voltage is supplied to the feedback transistor 12 via a feedback connection that includes a feedback resistor or current limiting resistor 67 which aids in comparing the output signal at the output terminals 65 with the input signal at the base 13 of the transistor 12. The feedback connection via the resistor 67 to the emitter 18 of the transistor 12 enables the input signal to the amplifier assembly to be compared with the output signal of the amplifier assembly. This comparison will bias the transistor into heavy or low conduction dependent on whether the difference between the output signal and input signal is large or small. From this it can be seen that the output produced at the collector 16 will maintain the equality between the input signal and the output signal of the amplifier assembly.

Alternatively the transistor 12 may be regarded as a variable impedance element that is connected to the input terminals of the amplifier assembly, to the output terminals of the amplifier assembly and to ground. This variable impedance feedback connection via this solid state element 12 is a significant aspect of the invention that enables the amplifier assembly to drive a very low impedance source such as an impedance having a value of 1 ohm or less.

The amplifier assembly described above may be constructed from the following components:

| Elements: | Values of the elements |
|---|---|
| Capacitor **10** | Electrolytic, 15 volts. |
| Resistor **15** | 6800 ohms, ¼ watt. |
| Resistor **14** | 10,000 ohms, ¼ watt. |
| Transistor **12** | 2N1304–NPN. |
| Transistor **22** | 2N1300–PNP. |

| Elements: | Values of the elements |
|---|---|
| Resistor **24** | 1,000 ohms, ¼ watt. |
| Resistor **26** | 1,000 ohms, ¼ watt. |
| Transistors **42** and **52** | 2N1478–PNP. |
| Resistor **46** | 220 ohms, ½ watt. |
| Resistor **55** | 220 ohms, ½ watt. |
| Resistor **67** | 330 ohms, ¼ watt. |

The frequency response and power output of this circuit depends in large part on the transistors selected and the related circuit parameters. The voltage gain is less than one; with approximately 2 volts at the input terminal less than 2 volts will result at the output terminal.

In summary a low impedance amplifier assembly is provided by combining the phase splitting means 20 with the push-pull amplifier means 40 and interconnecting the output of the push-pull amplifier means 40 with the input of the phase splitting means via a feedback connection which includes a solid state element or transistor 12. The phase splitting means 20 provides two outputs that are out of phase 180° and alternately cause one of the transistors 42 and 52 of the push-pull amplifier means 40 to become the dominant output element of the push-pull amplifier means. A significant portion of the output of the push-pull amplifier means is fed back to the phase splitting means 20 via the feedback transistor 12. This feedback enables the output of the amplifier assembly to be compared with the input to the amplifier assembly.

While the above detailed description has shown, described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. A power amplifier having a relatively low output impedance and adapted to receive an input signal comprising:

a push-pull amplifier means for amplifying power;

said push-pull amplifier means having input terminals, output terminals, a first transistor connected in circuit with said input terminals and said output terminals for a first selected voltage gain, a second transistor connected in circuit with said input terminals and said output terminals for a voltage gain less than said first voltage gain;

a phase splitting means for energizing said push-pull amplifier means;

said phase splitting means having input connections and output connections, one of said output connections directly connected in circuit with said first transistor of said push-pull amplifier means and another of said output connections directly connected in circuit with said second transistor;

a transistor having one of its elements operatively connected directly to said input connections, one of its elemens operatively connected to said output terminals and another of its elements adapted to receive said input signal and operatively connected to ground;

said transistor forming part of a feedback connection formed between said output terminals of said push-pull amplifier means and said input connections of said phase splitting means, said transistor exhibiting a variable impedance state corresponding to the total signal introduced to the element operatively connected to ground.

2. The amplifier of claim 1 wherein said transistor has emitter, collector and base electrodes, wherein the emitter is connected to the output terminals via a current limiting resistor, the collector is connected directly to the input connections, and the base is connected to ground via a biasing resistor, said base being further connected to said input signal, wherein the collector-emitter impedance of said transistor varies responsive to the difference between said input signal and the output signal appearing at the emitter electrode thereof.

References Cited by the Examiner

UNITED STATES PATENTS

| | | | |
|---|---|---|---|
| 2,943,266 | 6/1960 | Belland | 330—15 X |
| 3,023,368 | 2/1962 | Erath | 330—14 |
| 3,133,278 | 5/1964 | Millis | 330—16 X |

OTHER REFERENCES

Sulzer: "Junction Transistor Circuit Applications," Electronics, August 1953, pp. 170–173.

Application Engineering Digest No. 61: "Semiconductor Products," April 1961, p. 51.

Lin and White: "Single-Ended Amplifiers for Class B Operation," Electronics, May 29, 1959, pp. 86–87.

ROY LAKE, *Primary Examiner.*

R. P. KANANEN, *Assistant Examiner.*